United States Patent [19]

Chikaki

[11] Patent Number: 4,907,039
[45] Date of Patent: Mar. 6, 1990

[54] SEMICONDUCTOR DEVICE
[75] Inventor: Shinichi Chikaki, Tokyo, Japan
[73] Assignee: NEC Corporation, Tokyo, Japan
[21] Appl. No.: 211,330
[22] Filed: Jun. 24, 1988
[30] Foreign Application Priority Data
Jun. 25, 1987 [JP] Japan .................................. 62-159307
[51] Int. Cl.⁴ ............................................ H01L 23/48
[52] U.S. Cl. ......................................... 357/68; 357/54
[58] Field of Search ..................... 357/71, 72, 54, 68
[56] References Cited
U.S. PATENT DOCUMENTS
4,472,730 9/1984 Ohta ....................................... 357/71

4,733,289 3/1988 Tsurumaru ............................ 357/54

Primary Examiner—Andrew J. James
Assistant Examiner—Mark Prenty
Attorney, Agent, or Firm—Helfgott & Karas

[57] ABSTRACT

A semiconductor device in which a polyimide film is used as an inter-ply insulating film is disclosed. Bonding pads are formed on the polyimide film and an insulating film such as a silicon nitride film is formed on the polyimide film and on the bonding pads except bonding areas thereof. At least one small aperture is formed in the insulating film and a metal layer having an island shape is provided on the polyimide film within the small aperture.

13 Claims, 4 Drawing Sheets

SEMICONDUCTOR DEVICE

BACKGROUND OF THE INVENTION

The present invention relates to a semiconductor device, and more particularly, to a semiconductor integrated circuit device having a multi-wiring structure using a polyimide film as an interlevel or inter-ply insulating film.

The polyimide film has been widely used as a passivation film or an interlevel insulating film between upper and lower wiring layers. The polyimide film can be formed on a semiconductor substrate through a spin-coating method and subsequent heat treatment. It is to polymerize at a low temperature such as 400° C. or less. The polyimide film, however, is apt to absorb moisture, and therefore, the polyimide film is generally covered by an insulating film such as a silicon nitride film having moisture proof nature. Owing to the silicon nitride film, failures caused by leakage current between the upper and lower wiring layers through the polyimide film, by peeling-off of the polyimide film from the lower aluminum layer and by corrosion of the lower aluminum layer by moisture can be decreased to some extent.

In the prior art semiconductor device, however, at least one small opening is provided in the silicon nitride film, and a surface portion of the polyimide film within the opening is exposed and contacted directly to a molding resin. Namely, when the silicon nitride film is selectively removed to expose the bonding areas of the bonding pads by a well-known PR method, the aperture is simultaneously formed in the silicon nitride film. In one case, the aperture is inevitably formed by an alignment mark in a photo-mask used in the PR process step, and in the other case, the aperture is intentionally formed as a production control information pattern by which an operator can recognize that the process step for exposing the bonding areas of the bonding pads has been finished and which photo-mask has been employed in the process step, etc. Sometimes both of the aperture by the alignment mark and the aperture for the production control information pattern are formed in the silicon nitride film of the semiconductor chip, The area of the aperture is very small as compared to the whole upper surface area of the semiconductor chip. However, moisture reaching the small exposed surface portion of the polyimide film within the aperture affects seriously the resin mold semiconductor device, and therefore, failures of the devices caused by problems mentioned above cannot be sufficiently decreased.

SUMMARY OF THE INVENTION

Accordingly, an object of the present invention is to provide a semiconductor device in which failures caused by moisture are sufficiently decreased to enhance the reliability.

According to the present invention, there is provided a semiconductor device which comprises a semiconductor substrate, an organic film of polyimide formed on the substrate, bonding pads provided on the polyimide film, a first metal layer provided on the polyimide film and having an island-like plan shape, an insulating film such as a silicon nitride film having better moisture proof characteristics than the polyimide film and formed on the polyimide film, on the bonding pads and on the first metal layer, openings formed in the insulating film to expose bonding areas of the respective bonding pads, and a first aperture having a smaller area than the opening and formed in the insulating film on the first metal layer to expose a surface section of the first metal layer. The device may further comprise a second metal layer provided on the polyimide film and having an island shape, and a second aperture having a smaller area than the opening and formed in the insulating film and on the second metal layer to expose an surface section of the second metal layer. The first and second metal layers and the bonding pads may be made of aluminum. One of the first and second apertures may have a square shape, and the other may have a shape representing symbols of alphabets and/or numerals.

DESCRIPTION OF THE PRIOR ART

Figure 1A:
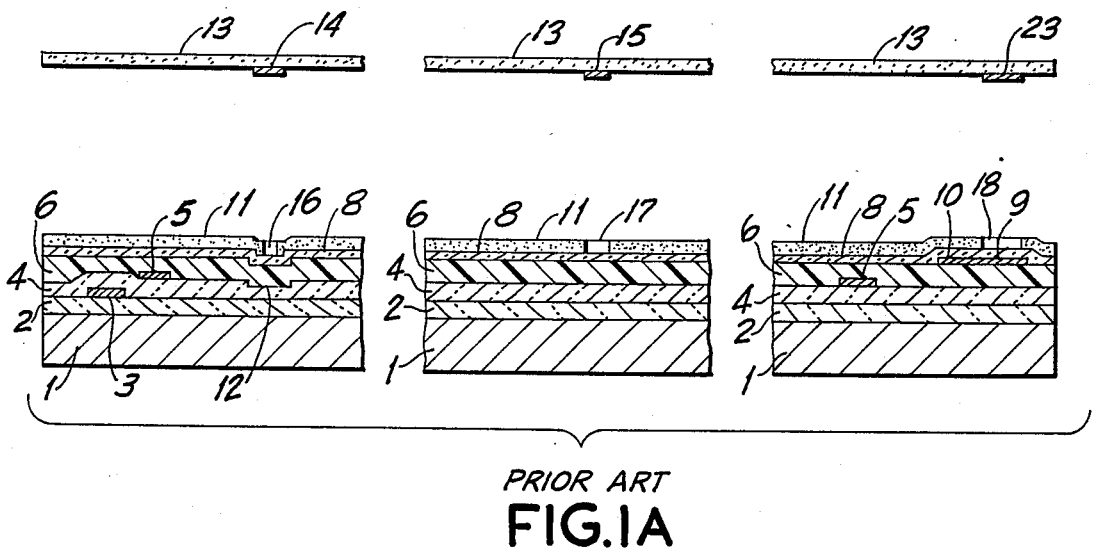
FIGS. 1A and 1B are cross-sectional views showing process steps for manufacturing a prior art semiconductor device in the wafer state.

Referring to FIG. 1A, a field silicon oxide layer 2 is formed on a field region of a silicon substrate 1, and a wiring pattern 3 by a first level aluminum layer is provided on the field silicon oxide layer 2. A second wiring pattern 5 by a second level aluminum layer is formed on an inter-ply insulating film 4 of silicon oxide by CVD process which covers the first level wiring pattern 3 and the field silicon oxide layer 2, and through-holes (not shown) are provided in the inter-ply insulating film 4 to connect the first and second level wiring patterns each other. Further, a alignment mark 12 of concavity having a square shape is formed in the upper surface of the inter-ply insulating film 4. A polyimide organic film 6 of about 2 μm thickness is formed entirely by a spin-coating method on the inter-ply insulating film 4 including the alignment mark 12 and on the second level wiring pattern 5, and a heat treatment is conducted to polymerize the polyimide at a temperature of about 400° C. A wiring pattern by a third level aluminum layer of about 1 μm thickness including bonding pads 9 (only one is shown) and third level wirings 10 (only one is shown) connected to respective bonding pads is formed on the polyimide film 6, and through-holes (not shown) are provided in the polyimide film 6 by an oxigen plasma etching method to connected the second and third wiring patterns each other. A plasma silicon nitride film 8 is entirely formed on the polyimide film 6 and on the third level wiring pattern. When a process step for exposing the bonding areas of the bonding pads 9 by removing selectively the silicon nitride film 8 is conducted by a well-known PR method, a photo-resist film 11 is entirely formed on the silicon nitride film 8 and a photo mask including a transparent substrate 13, a alignment mark pattern 14 of opaque material formed on the substrate 13 and having a square shape smaller than the mark 12 in the wafer, a production control information pattern 15 of opaque material formed on the substrate 13 and a bonding pad exposing pattern 23 of opaque material formed on the substrate 13 is provided above the wafer, that is, above the resist film 11. At first, an alignment between the photo-mask and the semiconductor wafer is conducted by inspecting with a microscope (not shown) and moving horizontally the photo-mask or the wafer such that the image 14', in the microscope, of the mark pattern 14 in the mask is positioned at the center of the image 12', in the microscope, of the mark 12 in the insulating film 4 of the wafer as shown in FIG. 1C. Thereafter, ultraviolet rays are irradiated through the photo-mask on the resist film 11, and then, by developing the resist film 11, openings 16, 17 and 18 corresponding to the opaque patterns 14, 15 and 23 in the photo-mask, respectively, are formed in the photo-resist film as shown in FIG. 1A. Next, the silicon nitride film 8 is selectively etched by using the photo resist film as a mask, and therefore, as shown in FIG. 1B, an aperture 19 corresponding to the alignment mark pattern 14 of the mask, an aperture 20 corresponding to the mark pattern 15 of the mask and using a production control pattern by which one can recognize that the process step for exposing the bonding areas of the bonding pads has been finished and what lot of photo-mask has been employed in the process step, etc., and openings 21 (only one is shown) corresponding to the pattern 23 of the mask to expose respective the bonding areas of the bonding pads 9 are formed in the silicon nitride film 8.

The aperture 19 having a square plan shape exposes a surface portion of 50 μm×50 μm area of the polyimide film 6 and aperture 20 having a symbol plan shape exposes a surface portion or portions of 10 μm² area of the polyimide film 6. These exposed surface portions are very small as compared to the exposed bonding area of 100 μm×100 μm of each bonding pad, and far smaller than the entire upper surface of the chip having, for example, 1000 μm×1000 μm area. However, these exposed portions of the polyimide film 6 within the apertures 19, 20 cause failures by moisture. For example, when twenty specimens of the resin mold semiconductor device installing the prior art semiconductor chip shown in FIG. 1B are conducted a pressure-cooker test under a temperature of 125° C., relative humidity of 100% and 2.3 atm (atmospheric pressure), after a lapse of 20 hours three to seven specimens are failed by problems due to moisture mentioned above.

EXPLANATION OF THE EMBODIMENT

Figure 1B:
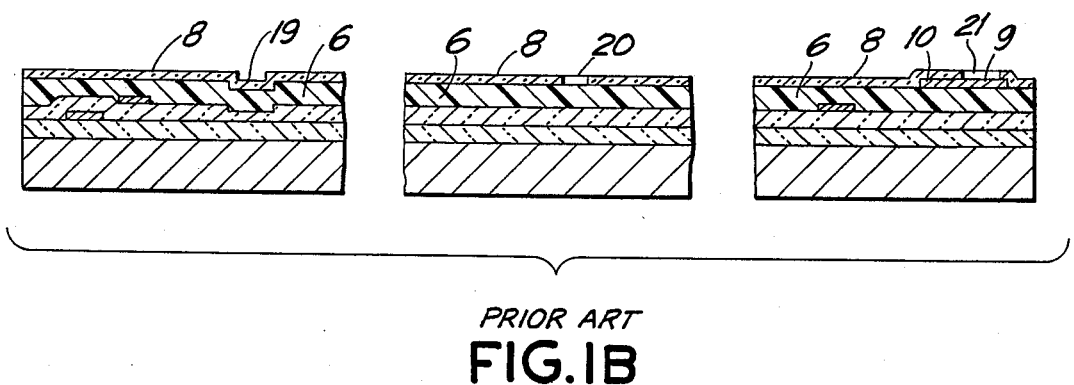
Figure 1C:
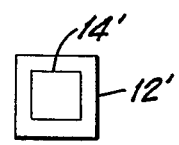
FIG. 1C is a schematic plan view showing a mask alignment condition.
Figure 2A:
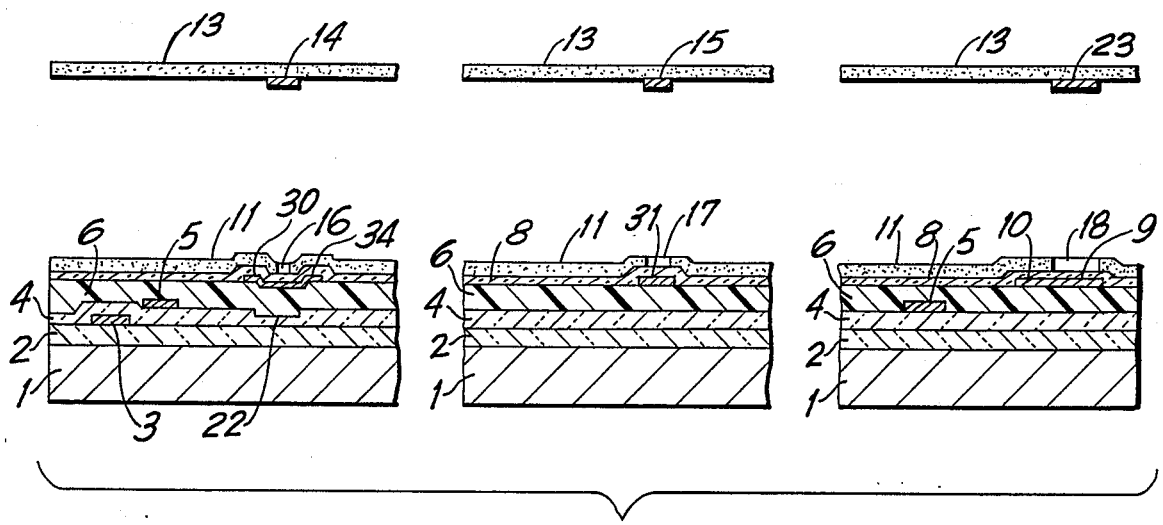
FIGS. 2A and 2B are cross-sectional views showing process steps for manufacturing an embodiment of the present invention in the wafer state.
Figure 2B:
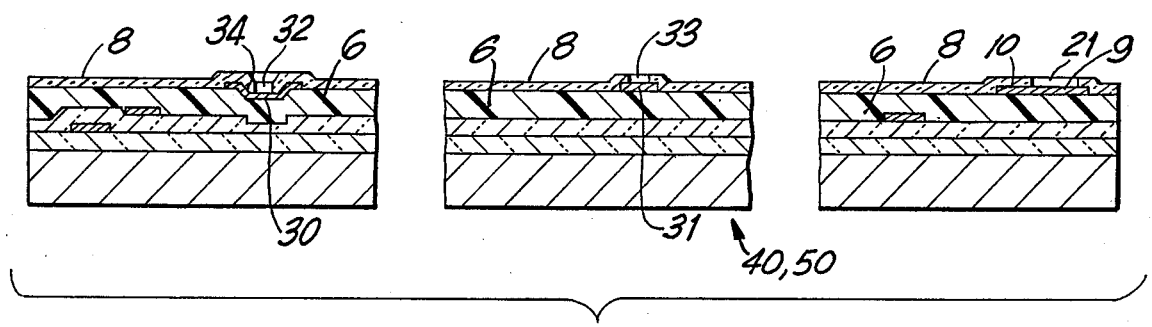
Figure 2C:
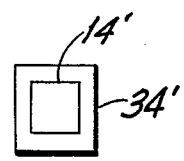
FIG. 2C is a schematic plan view showing a mask alignment condition.
Figure 3A:
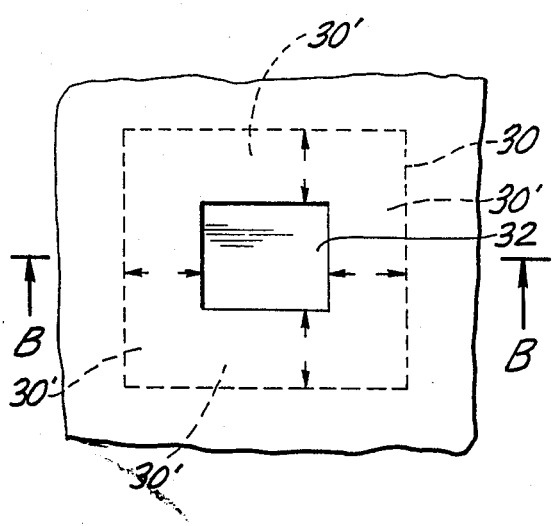
FIG. 3A is an enlarged plan view showing the aperture formed in the silicon nitride film by the alignment mark in the photo-mask and the structure in the vicinity of the aperture according to the embodiment of the present invention.
Figure 4A:
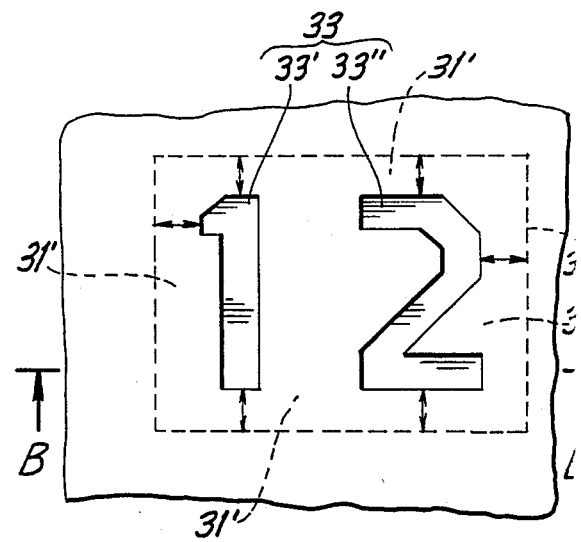
FIG. 4A is an enlarged plan view showing the aperture formed in the silicon nitride film as the production control information pattern and the structure in the vicinity of the aperture according to the embodiment of the present invention.
Figure 3B:
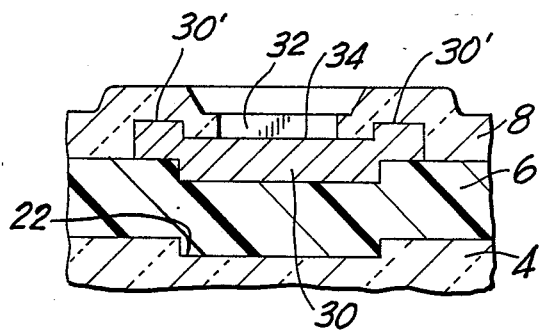
FIG. 3B is a cross-sectional view taken along line B—B in FIG. 3A as viewed in the direction of arrows.
Figure 4B:
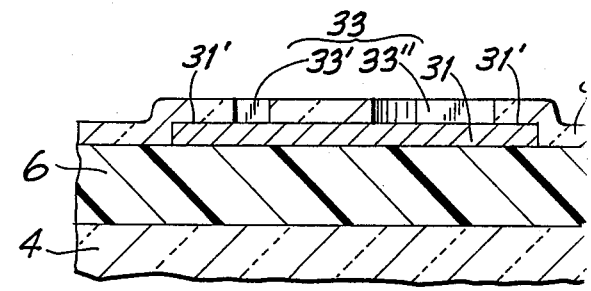
FIG. 4B is a cross-sectional view taken along line B—B in FIG. 4A as viewed in the direction of arrows.

Referring to FIGS. 2A to 2C, the same components as those in FIGS. 1A to 1C are indicated by the same reference numerals, and FIGS. 2A and 2B show only one semiconductor chip 40 in a semiconductor wafer 50. In the embodiment, an island shape aluminum layer 30 is formed on the polyimide organic film 6 above a concavity 22 which is formed in the inter-ply insulating film 4 and corresponds to the concavity 12 in FIG. 1, and a concavity 34 is formed in the aluminum layer 30 by a concavity in the polyimide film 6 provided by the concavity 22 in the insulating film 2. The concavity 22 in the inter-ply insulating film 2 may be omitted to form. In this case, a concavity is newly formed at the surface of the polyimide film 6 by removing selectively the surface of the film 6 by a dry etching method and forms the concavity 34 of the aluminum layer 30 along the newly formed concavity in the polyimide film 6. The concavity 34 in the island aluminum layer 30 is employed as the alignment mark in the wafer. Namely, when the alignment between the photo-mask and the semiconductor wafer 50 is conducted in the process to expose the bonding area of the bonding pad 9, the image 14', in the microscope, of the mark pattern 14 in the mask is positioned at the center of the image 34', in the microscope, of the concavity mark 34 of the island shape aluminum layer 30 as shown in FIG. 2C. Also, an island shape aluminum layer 31 is formed on the polyimide film 6 and under the silicon nitride film 8 of 0.5 μm thickness at a portion where the production control pattern is to be formed in the silicon nitride film. The silicon nitride film 8 is selectively etched by using the photoresist film as the mask in which the openings 16, 17, 18 are provided by the mask patterns 14, 15, 23, then an aperture 32 having a square plan shape of, for example, 50 μm×50 μm, an aperture 33 having symbol mark plan shape of, for example, 10 μm² area and opening 21 of, for example, 100 μm×100 μm are formed in the silicon nitride film 8 as shown in FIG. 2B. The aluminum layers 30 and 31 are provided under the apertures 32 and 33, respectively, and therefore, any surface portion of the polyimide film 6 is not exposed within the apertures. The aluminum layers 30, 31 are simultaneously formed with the bonding pads 9 and the upper wiring layers 10 connected to respective bonding pads 9 by patterning the third level aluminum layer of 1 μm thickness, and each of the aluminum layers 30, 31 has an island plan shape to which any wiring layer or bonding wiring is not connected. Namely, the aluminum layers 30, 31 are completely surrounded by the polyimide film 6 and the silicon nitride film 8 except their portions within the apertures 32, 33, and the portions within the apertures 32, 33 are completely attached to a mold region in the housing. Referring to FIGS. 3A and 3B, the aperture 32 in the silicon nitride film 8 by the alignment mark 14 in the photo-mask is provided on the center section of the aluminum layer 30 and the peripheral sections 30' of the aluminum layer 30 having the width w of 3 to 10 μm surrounding the center section are covered by the silicon nitride film 8. Therefore, moisture at the aperture 32 does not reach to the polyimide film 6. Also, referring to FIGS. 4A and 4B, the aperture 33 in the silicon nitride film 8 by the pattern 15 of the photo-mask is provided on the aluminum layer 31 and the peripheral sections 31' of the aluminum layer 31 having the minimum width x of 3 to 10 μm are covered by the silicon nitride film 8, and therefore, moisture at the aperture 33 does not reach to the polyimide film 6. The aperture 33 in the silicon nitride film 8 includes an aperture part 33' having a numeral "1" plan shape which represents the accomplishment of the process step for exposing the bonding areas of the bonding pads 9 in the wafer and an aperture part 33" having a numeral "2" plan shape which represents a mask lot using the process step. An alphabet symbol may be added to or changed to the numeral symbol.

Figure 5:
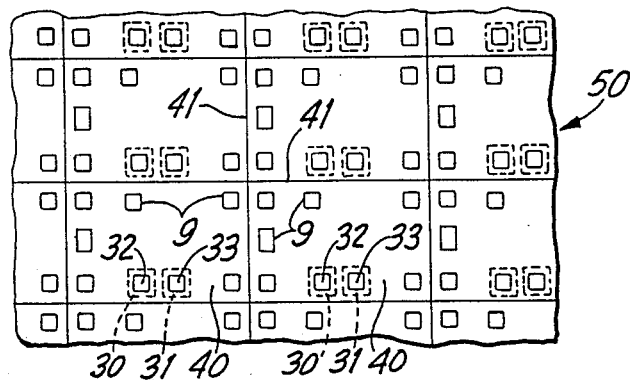
FIG. 5 is a plan view showing a part of the semiconductor wafer in which a plurality of chips of the embodiment of the present invention are formed.
Figure 6A:
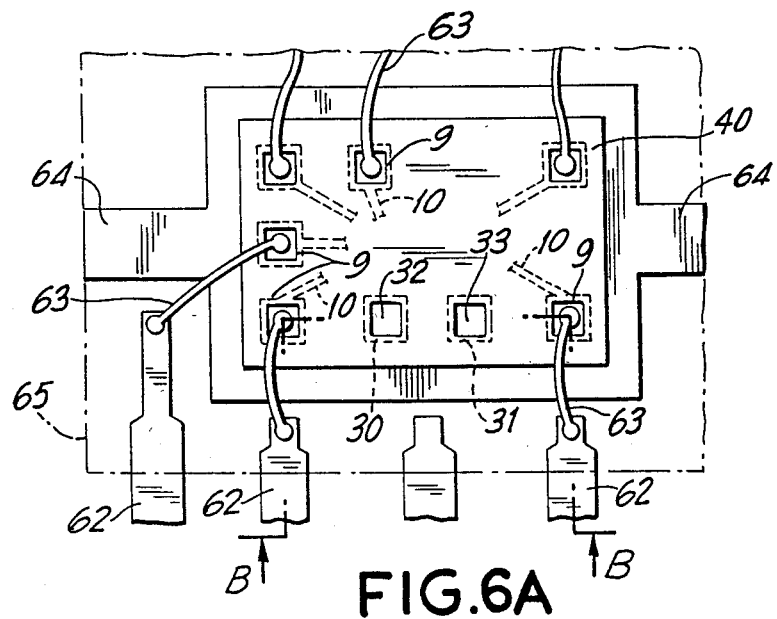
FIG. 6A is a plan view showing a part of a semiconductor device according to the embodiment of the present invention.
Figure 6B:
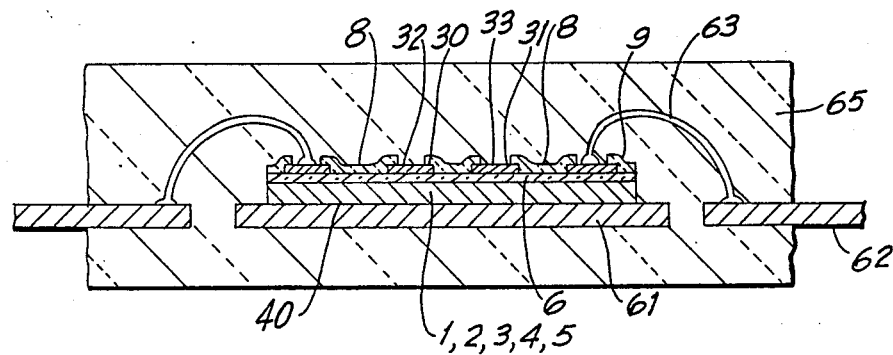
FIG. 6B is a cross-sectional view taken along line B—B in FIG. 6A as viewed in the direction of arrows.

After the process step shown in FIG. 2B, the semiconductor wafer 50 is divided into individual chips 40 of 1000 μm × 1000 μm plan area long dividing or scribe lines 41 shown in FIG. 5. Thereafter, as shown in FIGS. 6A and 6B, the semiconductor chip 40 according to the present invention is bonded on a mounting portion 61 of a lead frame connecting to support members 64 thereof, and respective bonding pads 9 and corresponding leads 62 of the lead frame are connected each other by metal thin wires 63. The structure is sealed by a mold resion 65 such as epoxy resin. In FIGS. 6A and 6B, the same components as those in FIGS. 2 to 5 are indicated by the same reference numerals. The polyimide film 6 is entirely provided on the semiconductor substrate, and the entire upper surface of the polyimide film 6 of the present invention is completely covered by the silicon nitride film 8 and metal layers 30, 31 and 9, that is, any portions of the upper surface of the polyimide film 8 are not contacted to the mold resin 65. A pressure-cooker test under 125° C. temperature, 100% relative humidity and 2.3 atm (atmospheric pressure) was conducted on twenty specimens of the semiconductor device shown in FIG. 6, and no failure was produced during 20 hours and after 200 hours lapse only one specimen was failed. The good result of the present invention depends on the structure in which the portions of the polyimide film 6 under the apertures 32, 33 in the silicon nitride film 8 are not directly contacted to the mold resin 65, but covered by the aluminum layers 30, 31 of island plan shape.

What is claimed is:

1. A semiconductor device comprising a semiconductor substrate, a polyimide film formed on said substrate, bonding pads provided on said polyimide film, a first metal layer provided on said polyimide film and having an island shape, said first metal layer being a completely electrically insulated layer, an insulating film having better moisture proof characteristics than said polyimide film and formed on said polyimide film to cover said bonding pads and said first metal layer, openings formed in said insulating film to expose bonding areas of said bonding pads, respectively, and a first aperture having a smaller area than each said opening and formed in said insulating film on said first metal layer to expose a surface section of said first metal layer.

2. A semiconductor device of claim 1, wherein said insulating film is a silicon nitride film.

3. A semiconductor device of claim 1, wherein said first metal layer and said bonding pads are made of aluminum.

4. A semiconductor device of claim 1, wherein said first aperture has a square plan shape.

5. A semiconductor device of claim 1, wherein said first aperture has a configuration of a symbol selected from the group consisting of numerical symbols and alphabetic symbols.

6. A semiconductor device of claim 5, wherein said first aperture has a numerical symbol configuration.

7. A semiconductor device of claim 5, wherein said first aperture has an alphabetic symbol configuration.

8. A semiconductor device of claim 1, further comprising a second metal layer provided on said polyimide film and having an island shape, said second metal layer being a completely electrically insulated layer, and a second aperture having a smaller area than each said opening and formed in said insulating film on said second metal layer to expose a surface section of said second metal layer.

9. A semiconductor device of claim 8, wherein said insulating film is a silicon nitride film.

10. A semiconductor device of claim 8, wherein said first and second metal layers and said bonding pads are made of aluminum.

11. A semiconductor device of claim 8, wherein said first aperture has a square plan shape, and said second aperture has a configuration of a symbol selected from the group consisting of numerical symbols and alphabetic symbols.

12. A semiconductor device of claim 11, wherein said second aperture has a numerical symbol configuration.

13. A semiconductor device of claim 11, wherein said second aperture has an alphabetic symbol configuration.

* * * * *